(12) United States Patent
Kurokawa et al.

(10) Patent No.: US 9,348,157 B2
(45) Date of Patent: May 24, 2016

(54) OPTICAL MODULE OUTPUTTING POLARIZATION COMBINED OPTICAL BEAM

(71) Applicant: Sumitomo Electric Industries, Ltd., Osaka-shi (JP)

(72) Inventors: Munetaka Kurokawa, Yokohama (JP); Tomoya Saeki, Yokohama (JP); Yasushi Fujimura, Yokohama (JP); Kazuhiro Yamaji, Yokohama (JP); Yasuyuki Yamauchi, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/509,651

(22) Filed: Oct. 8, 2014

(65) Prior Publication Data
US 2015/0098127 A1    Apr. 9, 2015

(30) Foreign Application Priority Data

Oct. 9, 2013    (JP) .................................. 2013-212165
Sep. 29, 2014   (JP) .................................. 2014-198093

(51) Int. Cl.

| | |
|---|---|
| *G02F 1/09* | (2006.01) |
| *H01S 5/00* | (2006.01) |
| *G02F 1/21* | (2006.01) |
| *H04B 10/50* | (2013.01) |
| *H01S 5/40* | (2006.01) |
| *G02B 27/28* | (2006.01) |
| *G02B 5/30* | (2006.01) |

(Continued)

(52) U.S. Cl.
CPC *G02F 1/093* (2013.01); *G02F 1/21* (2013.01); *H01S 5/4012* (2013.01); *H01S 5/4025* (2013.01); *H04B 10/50* (2013.01); *G02B 5/3083* (2013.01); *G02B 27/283* (2013.01); *G02F 2001/212* (2013.01); *H01S 5/0064* (2013.01); *H01S 5/02216* (2013.01); *H01S 5/02248* (2013.01); *H01S 5/02415* (2013.01)

(58) Field of Classification Search
CPC ..... G02F 1/093; G02F 1/21; G02F 2001/212; G02B 27/283; G02B 5/3083; H04B 10/50; H01S 5/4012; H01S 5/4025; H01S 5/0064; H01S 5/02216; H01S 5/02248; H01S 5/02415
USPC .................... 359/484.03; 385/11, 15, 24, 31; 398/201
See application file for complete search history.

(56) References Cited

U.S. PATENT DOCUMENTS

| | | | | |
|---|---|---|---|---|
| 5,768,015 | A * | 6/1998 | Pattie ...................... | G02F 1/093 359/282 |
| 6,317,250 | B1 * | 11/2001 | Guan ...................... | G02F 1/093 324/244.1 |

(Continued)

FOREIGN PATENT DOCUMENTS

| | | |
|---|---|---|
| WO | WO-2012/100209 | 7/2012 |
| WO | WO-2013/106466 | 7/2013 |

*Primary Examiner* — Frank Font
(74) *Attorney, Agent, or Firm* — Venable LLP; Michael A. Sartori; Todd R. Farnsworth

(57) ABSTRACT

A transmitter optical module for emitting a polarization polarized combined beam is disclosed. The transmitter optical module includes optical sources each emitting optical beams with substantially the same polarizations, an optical isolator, and a polarization beam combiner. The optical isolator, by receiving the optical beams, outputs the optical beams with polarizations perpendicular to each other to the polarization beam combiner.

17 Claims, 7 Drawing Sheets

(51) Int. Cl.
*H01S 5/022* (2006.01)
*H01S 5/024* (2006.01)

(56) References Cited

U.S. PATENT DOCUMENTS

| | | | |
|---|---|---|---|
| 6,879,746 B2* | 4/2005 | Li | G02F 1/31 385/11 |
| 7,079,319 B2* | 7/2006 | Helbing | G02B 6/2746 359/484.06 |
| 2002/0186914 A1* | 12/2002 | Li | G02B 6/272 385/11 |
| 2003/0072069 A1* | 4/2003 | Li | G02B 6/2746 359/251 |
| 2004/0032657 A1* | 2/2004 | Shirai | H01F 10/24 359/487.01 |
| 2004/0184148 A1* | 9/2004 | Chang | G02B 6/12007 359/484.03 |
| 2005/0030623 A1* | 2/2005 | Koh | G02F 1/31 359/484.03 |
| 2012/0189314 A1 | 7/2012 | Xu et al. | |

* cited by examiner

OPTICAL MODULE OUTPUTTING POLARIZATION COMBINED OPTICAL BEAM

BACKGROUND OF THE INVENTION

1. Field of the Invention

The present application relates to an optical module that outputs a polarization combined beam, in particular, the application relates to an optical module providing a polarization dependent optical isolator but outputs a polarization combined optical beam.

2. Background Arts

When an optical module outputs an optical signal that includes two optical beams each having a polarization perpendicular to the other, an optical isolator with of a polarization independent type is implemented to suppress backward optical beam. Light emitted from a laser diode (LD) and returning the LD reflected at a Fresnel interface of an end surface of an optical fiber and so on, the quality of the laser optical beam considerably degrades. An optical isolator put in the optical path from the LD effectively prevents the optical beam from returning to the LD. Two types of the optical isolator have been known, that is, the polarization dependent isolator (PDI) and the polarization independent isolator (PII). The former isolator substantially cuts the backward optical beam by a combination of two polarizers and a Faraday rotator, while, the latter isolator reduces the backward retuning to the LD by deflecting the optical axis of the backward optical beam.

Some optical modules includes a plural LDs arranged in on a line and outputs an optical beam combined with respective optical beams output from the LDs. In such an arrangement, the backward beam deflected by the PII possibly enters to neighbor LDs although one PIT may be placed for the combined beam. A PDI may substantially cut the backward beam; but, the PDI is unable to set for the polarization combined beam. It would be a best solution to prepare a plurality of PDIs each corresponding to respective LDs, but this arrangement requires an enough space to install PDIs within the transmitter optical module.

SUMMARY OF THE INVENTION

An aspect of the present application relates to a transmitter optical module that includes, first and second optical sources, a polarization beam combiner (PBC), and an optical isolator. The first and second optical sources emit first and second optical beams, respectively. The PBC combines the first and second optical beams each output from the optical isolator. A feature of the present invention is that the optical isolator includes first and second units, where the first unit, by receiving the first optical beam from the first optical source, outputs the first optical beam with a first polarization to the PBC, and the second unit, by receiving the second optical beam from the second optical source, outputs the second optical beam with a second polarization perpendicular to the first polarization.

Further feature of the present application is that the first and second units in the optical isolator provide PDIs and wave plates in respective outputs of the PDIs. The wave plate in the first unit has a crystallographic c-axis inclined by a quarter of a right angle from a transmission axis of the polarization dependent isolator of the first unit, and the wave plate of the second unit has a crystallographic c-axis forming a right angle with respect to the crystallographic c-axis of the wave plate of the first unit.

The transmitter optical module may further include a carrier for mounting the first second optical sources, the optical isolator, and the PBC on a primary surface thereof. The optical sources may be semiconductor laser diodes (LDs) each transmitting the optical beams with wavelengths different from others, respectively, where the optical beams have polarizations substantially in parallel to the primary surface of the carrier. The optical isolator, by receiving the optical beams from the optical sources, outputs the first optical beam with a polarization one of in parallel and in perpendicular to the primary surface, and the second optical beam with another polarization with another of in parallel and in perpendicular to the primary surface.

The transmitter optical module of may include an optical modulator of a type of a Mach-Zehnder (MZ) modulator with first and second output ports as the first and second optical sources, respectively. The transmitter optical module may further include a carrier for mounting, on a primary surface thereof the MZ modulator, the PBC, and the optical isolator with a sub-mount that mounts the first and second units thereon. The polarizations of the first and second optical beams output from the first and second output ports of the MZ modulator are in parallel to the primary surface of the carrier. However, the polarization of one of the first and second optical beams output from the optical isolator is in perpendicular to the primary surface of the carrier but the polarization of another of the first and second optical beams output from the optical isolator is in parallel to the primary surface of the carrier.

Another aspect of the present application relates to an optical isolator. The optical isolator provides first and second units and first and second wave plate. Each of the first and second units includes an input linear polarizer, a Faraday rotator, and an output linear polarizer. The input polarizers have respective transmission axes in parallel to the others. The output linear polarizers have respective transmission axes in parallel to the others but making a half of a right angle with respect to the transmission axes of the input linear polarizer. The first wave plate in a crystallographic c-axis thereof is set to be inclined by a quarter of a right angle with respect to a transmission axis of the output linear polarizer of the first unit. The second wave plate in a crystallographic c-axis thereof is set to make a right angle with respect to the crystallographic c-axis of the wave plate in the first unit.

BRIEF DESCRIPTION OF DRAWINGS

The present invention will now be described by way of example only, and not in any limitative sense with reference to the accompanying drawings in which.

DESCRIPTION OF EMBODIMENTS

Next, some embodiments according to the preset application will be described as referring to drawings. In the description of the drawings, numerals or symbols same with or similar to each other will refer to elements same with or similar to each other without overlapping explanations.

Figure 1:
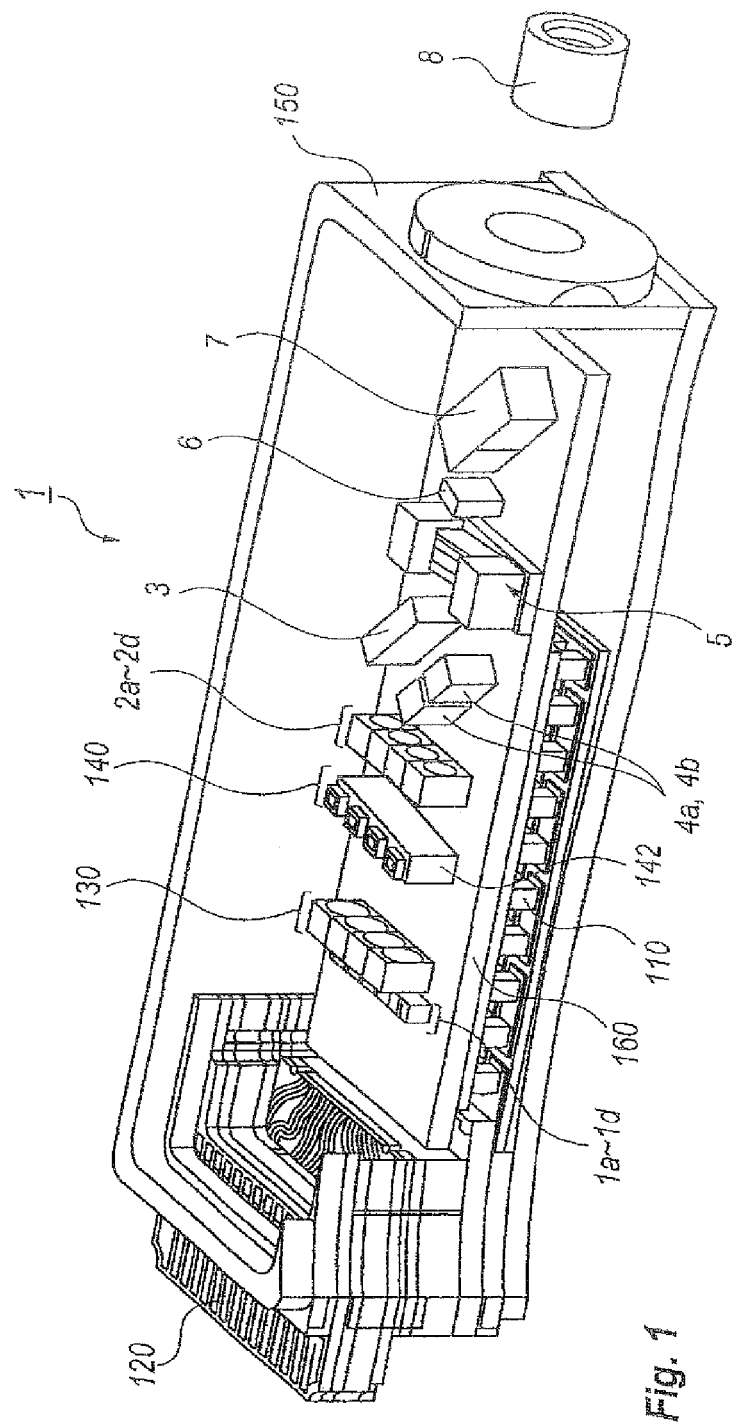
FIG. 1 a perspective showing an inside of a transmitter optical module according to the first embodiment of the invention.
Figure 2:
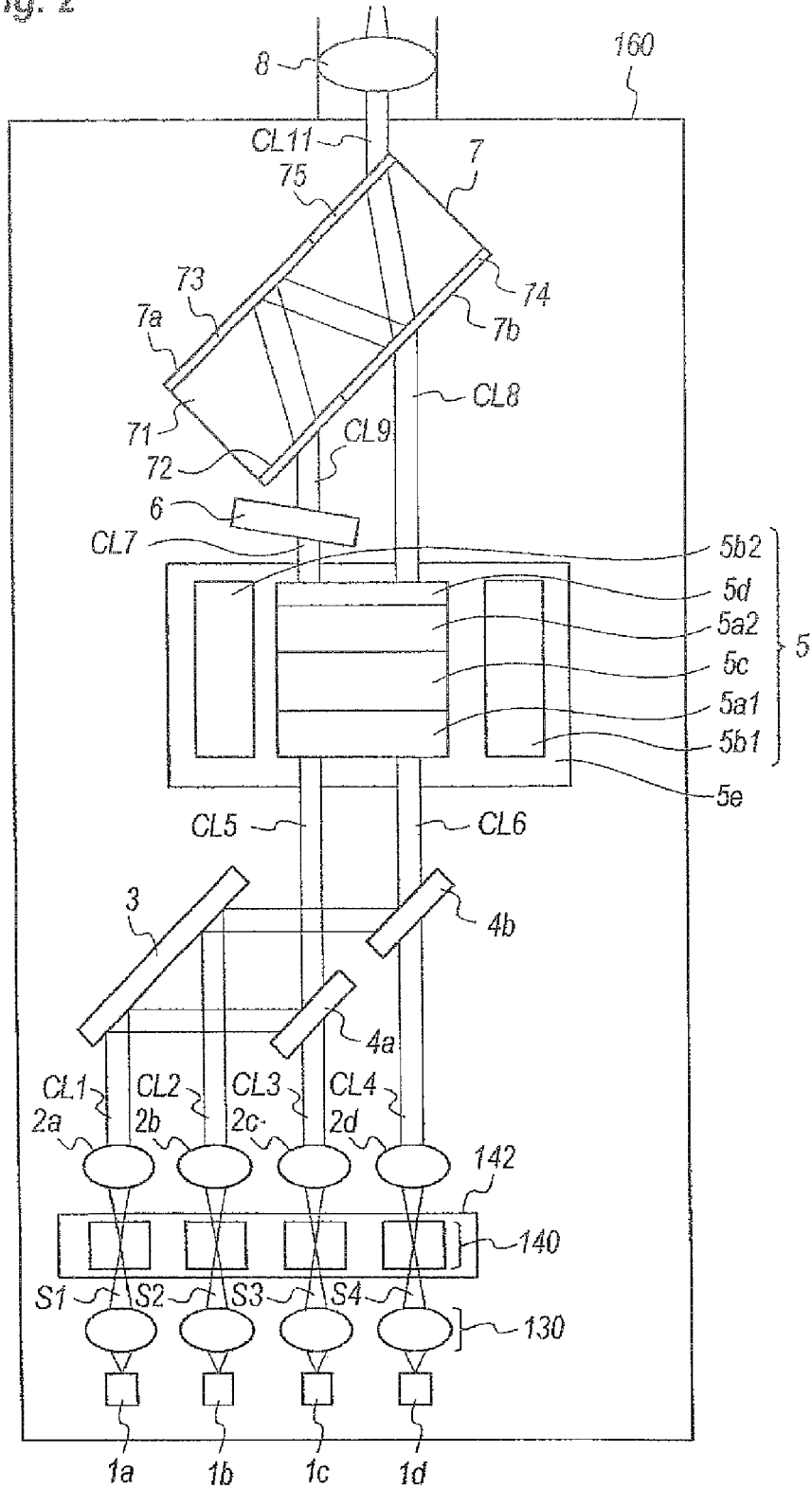
FIG. 2 is a plan view schematically showing the optical combining system for four LDs.

The first embodiment of a transmitter optical module for the WDM optical communication will be descried as referring to FIGS. 1 and 2. FIG. 1 is a perspective view showing an inside of the transmitter optical module 1, while, FIG. 2 schematically illustrates the optical coupling system of the transmitter optical module 1. The transmitter optical module 1 of the embodiment provides a box-shaped package with an optical coupling unit including a concentrating lens 8 in one side 150 and an electrical plug 120 to electrically communicate with external devices in another side opposite to the former side 150. The package further installs in the bottom thereof a thermo-electric-cooler (TEC) 110. The TEC 110 mounts a plurality of LDs and optical components thereon through a carrier 160. The package may further install drivers electrically that is connected to the plug 120 and driving the LDs. The carrier 160, as described above, mounts the LDs, 1a to 1d, first lenses 130, monitor photodiodes (mPDs) 140 through a sub-mount 142, collimating lenses, 2a to 2d, a mirror 3, first and second WDM filters, 4a and 4b, an optical isolator 5, a half-wave plate 6, and a polarization beam combiner (PBC) 7.

The LDs, 1a to 1d, are arranged in an array extending in perpendicular to the longitudinal axis of the transmitter optical module 1. The LDs, 1a to 1d, emit respective optical beams, S1 to S4, toward the longitudinal direction. The respective optical beams, S1 to S4, each has a wavelength specific thereto and different from others. The wavelengths, $\lambda 1$ to $\lambda 4$, preferably correspond to respective channel grids defined in the Local Area Network Wavelength Division Multiplexing (LANDWM) system, but not restricted thereto. Moreover, the wavelengths, $\lambda 1$ to $\lambda 4$, preferably have a relation of $\lambda 1 < \lambda 2 < \lambda 3 < \lambda 4$ but not restricted to this arrangement. When the LDs, 1a to 1d, are, so called, the edge emitting type, and arranged on the carrier 160 such that the active layers thereof are substantially in parallel to the primary surface of the carrier 160; the optical beams, S1 to S4, have the polarization in parallel to the primary surface of the carrier 160.

The first lenses 130, whose counts is same with the number of the LDs, 1a to 1d, each concentrates the optical beams, S1 to S4, and respective focal points substantially coincide with the focal points of respective collimating lenses, 2a to 2d. This optical arrangement may expand tolerances of the optical alignments of the optical system shown in FIG. 2 compared with an optical system where the collimating lenses, 2a to 2d, directly receive the optical beams, S1 to S4, without interposing the first lenses 130. The mPDs 140, whose count is also same with the number of the LDs, 1a to 1d, are mounted on the sub-mount 142 and each receives respective portion of the optical beams, S1 to S4. Specifically, the sub-mount 140 includes two prisms made of material transparent to optical beams, S1 to S4, and optically attaches respective hypotenuses. The interface, the attached hypotenuses, operates as a half mirror to divide the optical beams, S1 to S4, into respective two beams, one of which further advances along the longitudinal axis of the package, while, the other heads toward the normal of the carrier 160 to reach the mPDs 140.

The collimating lenses, 2a to 2d, convert the optical beams, S1 to S4, into respective collimated beams, CL1 to CL4. The mirror 3 reflects the collimated beam CL1 coming from the first collimating lens 2a toward the first WDM filter 4a, and another collimated beam CL2 coming from the second collimating lens 2b toward the second WDM filter 4b. The first WDM filter 4a shows high reflectance at a wavelength $\lambda 1$, which means low transmittance thereat, but high transmittance at a wavelength $\lambda 3$, namely, low reflectance thereat. That is, the first WDM filter 4a reflects almost whole of the first collimated beam CL1 coming from the mirror 3, but transmits almost whole of the third collimated beam CL3 coming from the third collimating lens 2c. Accordingly, the fifth collimated beam CL5 output from the first WDM filter 4a includes two collimated beams, CL1 and CL3. The second WDM filter 4b has high reflectance at a wavelength $\lambda 2$, namely, low transmittance thereat, bur high transmittance at a wavelength $\lambda 4$, namely, low reflectance thereat. That is, the second WDM filter 4b reflects almost whole of the second collimated beam CL2 and transmits almost whole of the fourth collimated beam CL4. Accordingly, the sixth collimated beam CL6 output from the second WDM filter 4b includes two collimated beams, CL2 and CL4. The optical components arranged from the LDs, 1a to 1d, to two WDM filters, 4a and 4b, that is, the first lenses 130, the collimating lenses, 2a to 2d, the mirror 3 and two WDM filters, 4a and 4b, do not affect the polarizations of the optical beams, S1 to S4, or maintain the polarizations of the optical beams, S1 to S4. That is, two collimated beams, CL5 and CL6, have respective polarizations substantially in parallel to the primary surface of the carrier 160.

The optical isolator 5 transmits two collimated beams, CL5 and CL6, coming from respective WDM filters, 4a and 4b, as the output beams, CL7 and CL8, but prevent optical beam from reversely propagating, that is, the optical isolator 5 prevents optical beam or optical beams coming from a side of the PBC 7 from advancing the LDs, 1a to 1d. Two collimated beams, CL7 and CL8, output from the isolator 5 may have the polarization same with that of the collimated beams, CL5 and CL6, namely, in parallel to the primary surface of the carrier 160; or the polarization in perpendicular to the primary surface of the carrier 160. The explanation below assumes that two collimated beams, CL7 and CL8, have the polarizations in parallel to the primary surface of the carrier 160. Details of the optical isolator 5 will be described later.

The half-wave plate 6, whose crystallographic c-axis is inclined by 45° with respect to the primary surface of the carrier 160. Under such an arrangement of the half-wave plate 6, the half-wave plate 6 may output a collimate beam CL9 as rotating the polarization thereof by 90°. That is, the half-wave plate 6 receives one of the collimated beams CL7 whose polarization is in parallel to the primary surface of the carrier 160, and outputs the collimated beam CL9 whose polarization is rotated by 90° from that of the input collimated beam CL7. Thus, the polarization of the output collimated beam CL9 becomes in perpendicular to the primary surface of the carrier 160.

The PBC 7 includes a base 71, a high-reflection (HR) film 73 and an anti-reflection (AR) film 75 on the first surface 7a of the base 71, an anti-reflection (AR) film 72 and a polarization combining filter 74 on the second surface 7b of the base 71. The PBC 7 combines the collimated beams, CL8 and CL9, depending on the polarizations thereof, and outputs a polarization combined beam CL11 to the concentrating lens 8.

Mechanisms of two WDM filters, 4a and 4b, and the polarization combining filter 74 are explained as referring to FIGS.

Figure 3A:
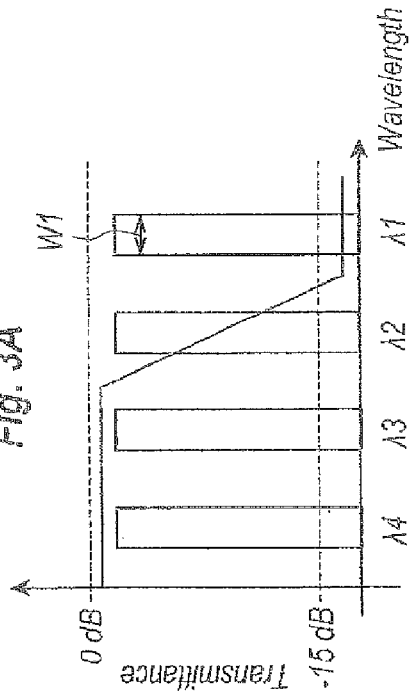
FIGS. 3A and 3B schematically show transmittance of two wavelength division multiplexing (WDM) filters, and FIG. 3C schematically shows transmittance and reflectance of the polarization beam combiner (PBC)
Figure 3B:
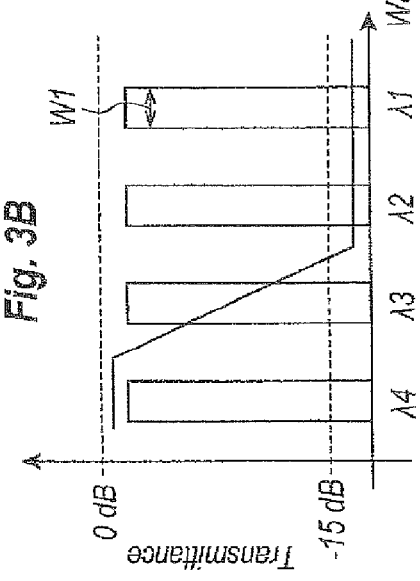
Figure 3C:
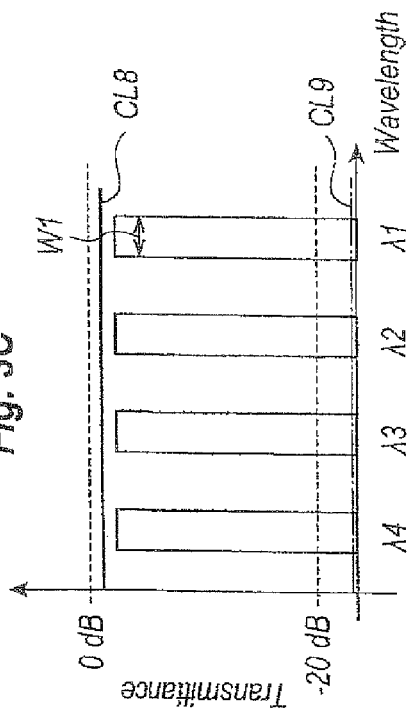

3A to 3C. FIG. 3A shows the transmittance of the first WDM filter 4a, FIG. 3B shows the transmittance of the second WDM filter 4b, and FIG. 3C shows the transmittance of the polarization combining filter 74. The collimated beams, CL1 to CL4, have respective band width W. Referring to FIG. 3A, the first WDM filter 4a transmits optical beams with wavelengths, λ3 and λ4, but reflects optical beam with a wavelength λ1. Accordingly, the first WDM filter 4a merges two collimated beams, CL1 and CL3, where the former has the wavelength λ1 reflected by the WDM filter 4a, while, the latter has the wavelength λ3 transmitted through the WDM filter 4a. Referring to FIG. 3B, the second WDM filter 4b transmits optical beam with a wavelength λ4 transmitted thereof but reflects optical beams with wavelengths, λ1 and λ2, reflected by the second WON filter 4b. Note that the first WDM filter 4a shows substantial transmittance and substantial reflectance at a wavelength λ2, while, the second WDM filter 4b shows substantial transmittance and substantial reflectance at a wavelength λ3. However, the former WON filter 4a is unconcerned to an optical beam with the wavelength λ2, while the latter WDM filter 4b is unconcerned to an optical beam with the wavelength λ3. Accordingly, two filters, 4a and 4b, are unnecessary to have a steep cut-off performance.

The polarization combining filter 74 shows high reflectance (low transmittance) for optical beams with the polarization along the first direction while low reflectance (high transmittance) for optical beams with the polarization along the second direction. Specifically, the polarization combining filter 74 has high transmittance for the collimated beam CL8 with the polarization in parallel to the primary surface of the carrier 160 in whole range of wavelengths, λ1 to λ4, but shows high reflectance for the collimated beam CL9 with the polarization in perpendicular to the primary surface of the carrier 160 in the whole range of wavelengths, λ1 to λ4.

Figure 4:
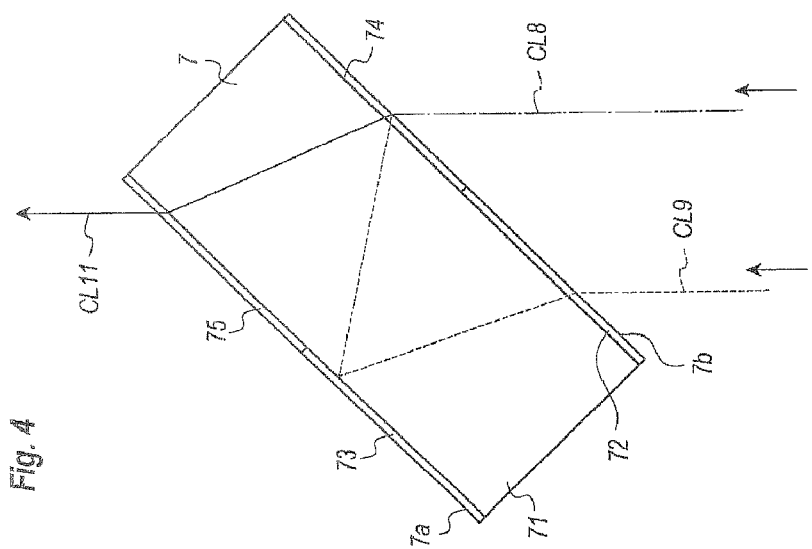
FIG. 4 schematically illustrates a structure of the PBC.

Next, the PBC 7 will be explained as referring to FIG. 4. The collimated beam CL9 coming from the half wave plate (λ/2 plate) 6 passes through the AR film 72, is totally reflected by the HR film 73, reflected again by the polarization combining filter 74, and passes through the AR film 75. The AR film 72, the base 71, and the HR film 73 maintain the polarization of the collimated beam CL9. These optical components do not disorder the polarization of the collimated beam CL9. On the other hand, the other collimated beam CL8 coming from the optical isolator 5 passes through the polarization combining filter 74 and through the AR film 75. Because two collimated beams, CL8 and CL9, have respective polarizations perpendicular to each other. In other words, the collimated beam CL8 has one of the s- and p-polarized beams, while, the other collimated beam CL9 has another of the s- and p-polarized beams. Accordingly, the collimated beam CL11 output from the polarization combining filter 74 contains both of the s- and p-polarized beams.

The transmitter optical module 1 for the WDM communication thus described provides the optical isolator 5, namely, the polarization dependent optical isolator 5, between two WDM filters, 4a and 4b, and the PBC 7. Similar to an optical isolator with the polarization independent type and put outside of the concentrating lens 8, which is a conventional arrangement for the transmitter optical module having a PBC, the present transmitter module 1 may effectively cut stray optical beams advancing backward to the LDs, 1a to 1d, from the side of the PBC 7. The LDs, 1a to 1d, may maintain the coherency thereof.

Figure 5:
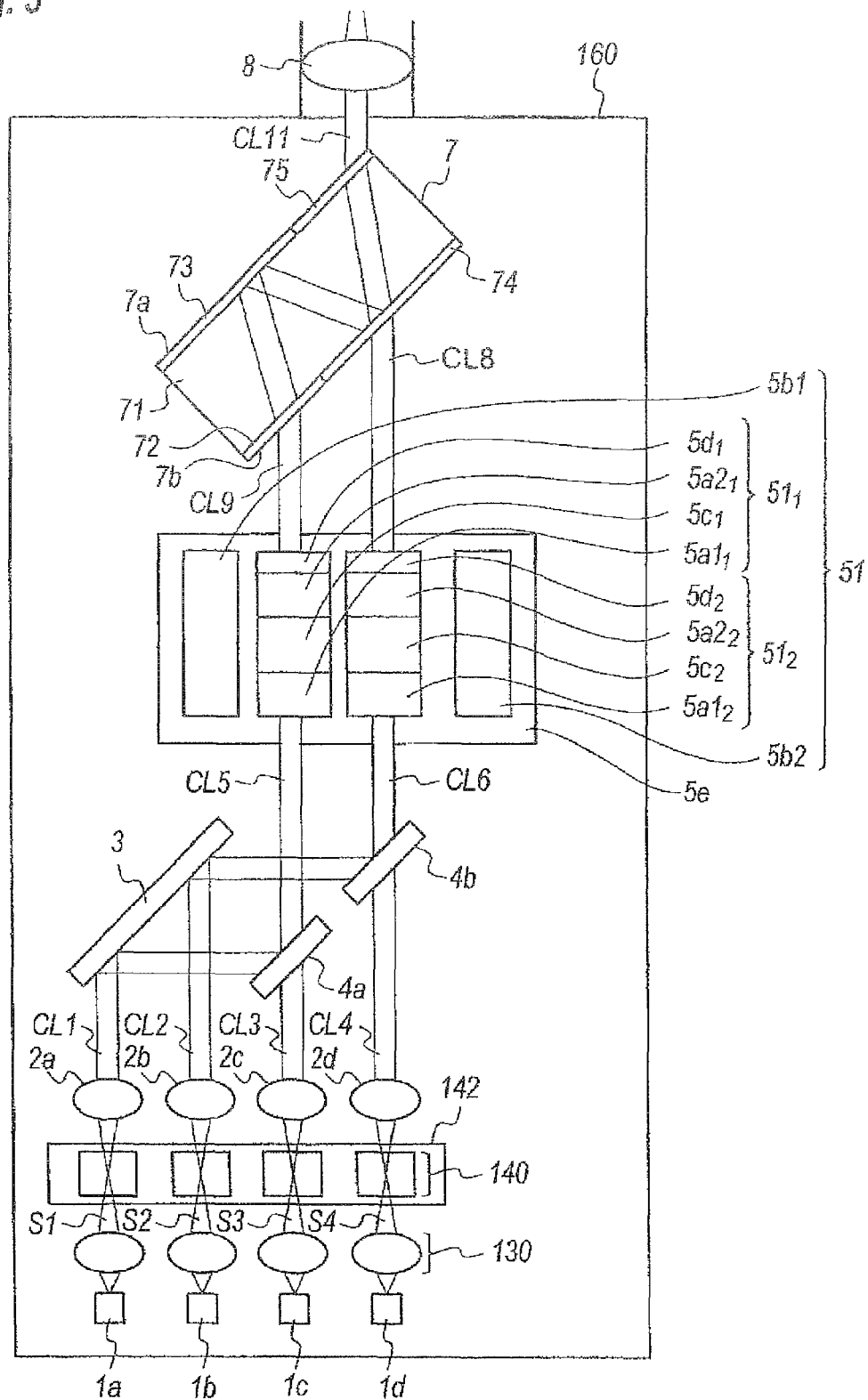
FIG. 5 is a plan view schematically showing the optical combining system for four LDs according to the second embodiment of the present applications.

FIG. 5 shows another arrangement of the optical isolator 51 according to the second embodiment of the present invention, which is modified from the aforementioned optical isolator 5 shown in FIG. 2. Specifically, the transmitter module 1A for the WDM communication removes the half wave plate 6 set in the downstream of the optical isolator 5 but implements another type of the optical isolator 51. That is, the optical isolator 51 of the present embodiment provides two units, $51_1$ and $51_2$, between two magnets, $5b_1$ and $5b_2$. Each of the units, $51_1$ and $51_2$, includes a set of the input and output linear polarizers, $5a1_1$ and $5a2_1$, a set of input and output linear polarizes, $5a1_2$ and $5a2_2$, Faraday rotators, $5c_1$ and $5c_2$, each put between the respective input and output linear polarizers, and wave plates, $5d_1$ and $5d_2$, put in the downstream of respective units, $51_1$ and $51_2$. Two units, $51_1$ and $51_2$, have the same arrangement for the input and output linear polarizers and the Faraday rotator except for the wave plates, $5d_1$ and $5d_2$.

Figure 6B:
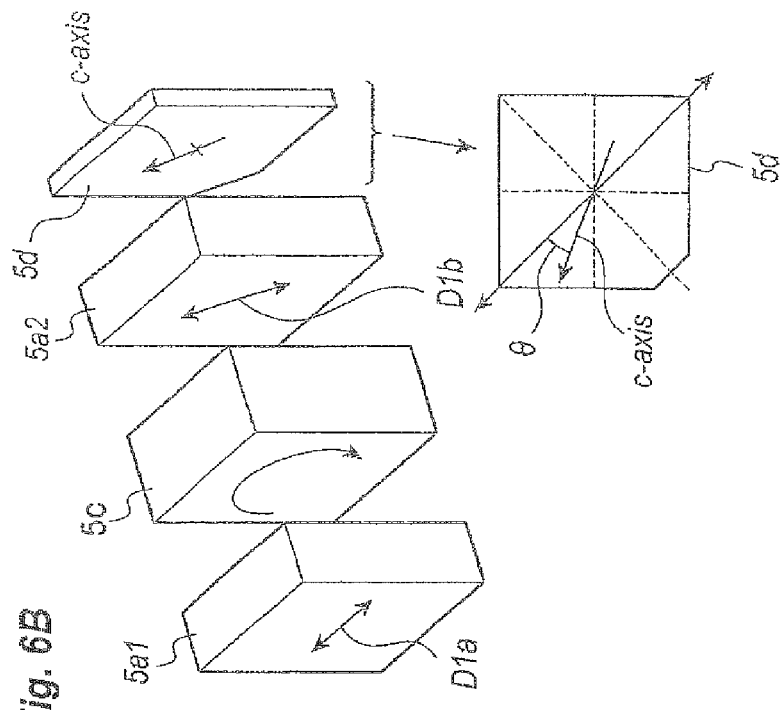
FIG. 6B illustrates a mechanism of the second unit each installed in the optical isolator according to the second embodiment.
Figure 6A:
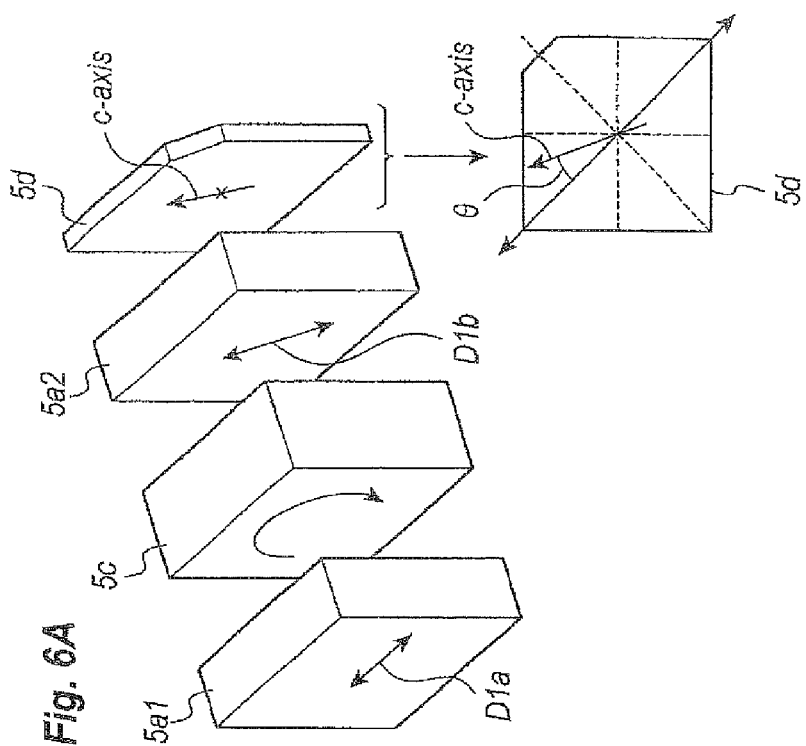
FIG. 6A illustrates a mechanism of the first unit.

The function of the optical isolator, 5 and 51, according to the present invention will be described as referring to FIG. 6. The optical isolator 5 of the first embodiment is first explained. Referring to FIG. 6A, the input linear polarizer 5ai has the transmission axis along the first direction only passes an optical beam with the polarization D1a along the first direction. The explanation below assumes that the first direction is horizontal, namely, in parallel to the primary surface of the carrier 160. When an optical beam containing the polarization along the first direction enters the input linear polarizer 5ai, the input linear polarizer 5ai only passes the component having the horizontal polarization Dla. The Faraday rotator 5c, which is set in the magnetic field formed by two magnets, 5bi and 5b2, and has substantial magneto-optical co-efficient, rotates the polarization of the optical beam passing therethrough by an angle R per unit length of the Faraday rotator and unit magnetic field strength. Then, the optical beam output from the Faraday rotator 5c has the polarization rotating from that of the input optical beam. The direction of the magnetic field is set to rotate the polarization clockwise viewed from the input linear polarizer 5ai, and the strength thereof is set so as to rotate the polarization by preset angle. The output linear polarizer 5a2 has the polarization substantially equal to this preset angle caused by the Faraday rotator 5c. That is, the output linear polarizer 5a2 has the transmission axis coincident with the polarization of the optical beam output from the Faraday rotator 5c. Thus, the optical beam output from the Faraday rotator 5c may transmit the output linear polarizer 5a2.

On the other hand, for an optical beam entering the output linear polarizer $5a_2$ and heading the Faraday rotator 5c, the output linear polarizer $5a_2$ only passes the optical beam with the polarization component coincident with the transmission axis of the output linear polarizer $5a_2$, that is, the optical beam output from the output linear polarizer $5a_2$ has the polarization inclined by the preset angle. The Faraday rotator 5c further rotates the polarization of the optical beam passing therethrough clockwise viewed from the input linear polarizer $5a_1$ by the preset angle. Accordingly, the optical beam output from the Faraday rotator 5c toward the input linear polarizer $5a_1$ has the polarization rotating twice of the preset angle. Setting the present angle to be 45°, that is, the strength of the magnetic field and the thickness of the Faraday rotator 5c are set so as to rotate the polarization of the optical beam passing therethrough by 45°, the optical beam from the output linear polarizer $5a_2$ to the input linear polarizer $5a_1$ has the polarization perpendicular to the transmission axis of the input linear polarizer $5a_1$, which means that the optical beam coming from the output linear polarizer $5a_2$ is unable to pass the optical isolator 5.

The optical isolator 5 of the first embodiment further provides, in the downstream of the output linear polarizer $5a_2$, a wave plate $5d$. As described above, the optical beam output from the output linear polarizer $5a_2$ has the polarization inclined by 45° from the horizontal. The wave plate $5d$ converts the polarization of the optical beam passing therethrough by 45° or −45°. That is, the optical beam output from the wave plate $5d$ has the horizontal or vertical polarization.

As for a wave plate $5d$, when an optical beam enters a wave plate as a polarization of the optical beam makes an angle of θ against the crystallographic c-axis of the wave plate, the wave plate may output an optical beam with the polarization of −θ against the crystallographic c-axis. That is, the wave plate may rotate the polarization of the output beam by 2θ with respect to the input beam. In the arrangement shown in FIG. 2, the optical beam output from the output linear polarizer $5a_2$ has the polarization with an angle of 45° against the horizontal. Setting the wave plate in the downstream of the output linear polarizer $5a_2$, and the crystallographic c-axis thereof with an angle of 90−45/2=67.5° against the horizontal, the wave plate may output the optical beam with the vertical polarization. When the wave plate is set such that the optical crystallographic c-axis makes an angle of 22.5° against the horizontal, the wave plate may output the optical beam with the horizontal polarization. The wave plate 6 set in the downstream of the optical isolator 5 for the optical beam CL7 rotates the polarization thereof by 90°. That is, the wave plate 6 is set such that the crystallographic c-axis thereof makes an angle of 45° against the horizontal.

In the arrangement of the optical isolator 51 shown in FIG. 5, the units, $51_1$ and $51_2$, have wave plates, $5d_1$ and $5d_2$, in respective outputs, where one of which has the crystallographic c-axis thereof inclined by 67.5° with respect to the horizontal; and the other has the crystallographic c-axis inclined by 22.5° against the horizontal. Thus, the optical beam output from the first unit $51_1$ and that output from the second unit $51_2$ have respective polarizations perpendicular to each other, where one of the polarizations is in parallel to the primary surface of the carrier 160, and the other is in perpendicular to the primary surface of the carrier 160. Thus, the arrangement of the optical isolator 51 shown in FIG. 5 may remove the half wave plate 6 provided in the aforementioned optical isolator 5, where the half wave plate 6 is set in only one of the output collimated beam CL7.

Two wave plates, $5d_1$ and $5d_2$, are different from the other only in one point of the angle of the crystallographic c-axis against the horizontal, where one of which makes an angle of 22.5°, and the other makes an angle of 67.5° against the horizontal. Moreover, one of the wave plates, for instance the wave plate $5d_2$ shown in FIG. 6B, may be obtained by rotating the other wave plate $5d_1$ shown in FIG. 6A by 180° around the axis along the transmission axis of the output linear polarizer, that is, the latter wave plate $5d_2$ may be obtained by setting the front surface in back.

All elements constituting the optical isolator of the embodiments, 5 and 51, are mounted on the sub-mount $5e$, which facilitates the optical alignment of the elements, or enhances the productivity of the transmitter optical module 1, that is, the process to assemble the transmitter optical module 1 first assembles the optical elements constituting the optical isolator, 5 or 51, on the sub-mount Se as performing the optical alignment thereof; and the sub-mount $5e$ providing the elements is mounted on the carrier 160 of the transmitter optical module 1. Thus, the process to assemble, or produce the transmitter optical module 1 may be simplified.

Moreover, two embodiments shown in FIGS. 2 and 5 provides the optical isolator, 5 or 51, providing a pair of magnets to form the magnetic field, and the elements of the input linear polarizer, the Faraday rotator, the output linear polarizer, where they constitute a polarization dependent isolator, are put between the magnets. However, an arrangement of the magnets is not restricted to those shown in FIGS. 2 and 5. For instance, a pair of magnets is unnecessary to be implemented in the optical isolator. Only one magnet, at least to form the magnetic field to the Faraday rotator, is inevitable for the optical isolator, 5 or 51. The one magnet may be set above the sub-mount extending in parallel to the sub-mount, or the magnet may mount the input and output linear polarizers, and the Faraday rotator thereon instead of the sub-mount.

The optical isolator 5 of the first embodiment provides the wave plate $5d$ in the output thereof, and the optical beams, CL7 and CL8, output from the isolator 5 align the polarizations thereof in parallel or perpendicular to the primary surface of the carrier 160. Accordingly, the half-wave plate 6 is interposed only in one of the output beams CL7 to rotate the polarization thereof by 90°. Thus, the PBC 7 may combine two beams, CL8 and CL9.

On the other hand, the other optical isolator 51 shown in FIG. 5 provides the wave plate $5d_1$ in the first unit $51_1$ and another wave plate $5d_2$ in the second unit $51_2$. Two wave plates, $5d_1$ and $5d_2$, have respective crystallographic c-axes making an angle therebetween of 45° so as to set the angle between respective polarizations to be 90°. Accordingly, the optical isolator 51 of the second embodiment may remove the half-wave plate 6.

Next, the third embodiment according to the present invention will be described as referring to FIG. 7. In an optical modulation module that combines two beams depending on the polarization thereof, where each of beams is phase-modulated by respective Mach-Zehnder modulator (MZ modulator) from a single optical beam, one of the beams output from the MZ modulator is rotated in the polarization thereof, and combined by a PBC with the other beam whose polarization is maintained. Such an optical modulator is necessary to provide an optical isolator to suppress stray optical beams entering the MZ modulator. Because the output beam from the MZ modulator often contains two independent beams with respective polarizations, the optical isolator implemented in the optical modulator is often a type of the polarization independent isolator. Although the polarization independent isolator is a popular device in an optical system, it is necessary to make the optical isolator compact enough in order to install within the optical modulator.

The third embodiment of the present invention relates to an optical modulator that implements the optical isolator of the type shown in FIGS. 2 and 5. Although the aforementioned optical isolators, 5 and 51, are the polarization dependent type, those isolators, 5 and 51, are set in upstream of the PBC 7 and the polarization of the beams passing through the optical isolator are rotated in the polarization thereof. Thus, the optical isolator, 5 or 51, may show the function equivalent to that with the polarization independent isolator.

Figure 7:
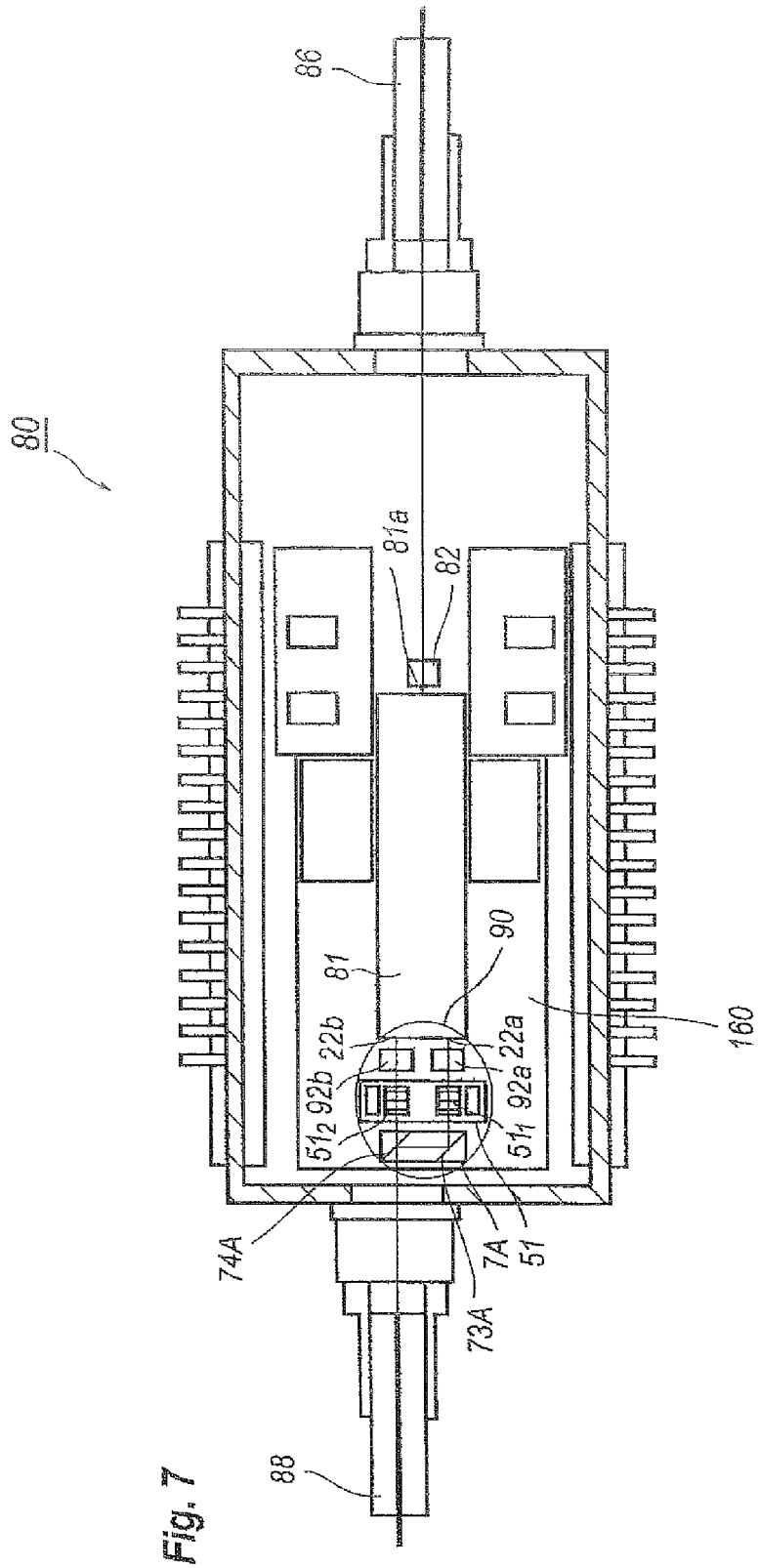
FIG. 7 is a plan view of another transmitter optical module having the Mach-Zehnder modulator and the optical coupling system similar to that shown in FIG. 5.

FIG. 7 is a plan view showing an optical modulator 80 that receives an optical beam of a continuous wave (CW) and outputs two optical beams each modulated with electrical signals and having respective polarizations perpendicular to the others. The optical modulator 80 includes an optical input port 86, an optical modulator 81 with the Mach-Zehnder type, an optical coupling system 90, and an optical output port 88.

The optical input port 86 provides a collimating lens to collimate an optical beam provided from an optical fiber into a collimated beam. This collimated beam is concentrated on an input port $81a$ of the MZ modulator 81 by a concentrating lens 82. The MZ modulator 81 includes two MZ elements each modulating the optical beam input therein by respective modulating signals, and outputs the modulated beams from respective output ports, 22a and 22b, of the MZ modulator 81 as divergent beams. The output ports, 22a and 22b, each shows the function of the optical source of the optical coupling system 90.

Two modulated beams, each output from the MZ modulator 81, enter the optical coupling system 90 put in the downstream of the MZ modulator 81. That is, the modulated beams are first collimated by the collimating lenses, 92a and 92b; then enter the optical isolator 51 having the aforementioned arrangement shown in FIG. 5. The optical isolator 51 provides two units, $51_1$ and $51_2$, each having the input linear polarizer, $5a1_1$ and $5a1_2$, the Faraday rotator, $5c_1$ and $5c_2$, the output linear polarizer, $5a2_1$ and $5a2_2$, and the wave plate, $5d_1$ and $5d_2$. The MZ modulator 81 leaves the polarization of the output beams as that of the input beam, that is, the MZ modulator 81 does not affect the polarization of the input beam. Moreover, the input beam is often provided from an LD whose output beam has an ellipsoid polarization. Accordingly, the output beams from the MZ modulator 81 each contains two polarizations. The input polarizers, $5a1_1$ and $5a1_2$, each extracts one of the polarizations, for instance, the polarization parallel to the carrier 160.

The Faraday rotator, $5c_1$ and $5c_2$, rotates the polarization of the beam entering therein by 45°. The magneto-optical co-efficient and the thickness of the Faraday rotator, $5c_1$ and $5c_2$, and the field strength formed by the magnets, $5b_1$ and $5b_2$, may adjust the rotating angle. The output linear polarizer, $5a2_1$ and $5a2_2$, each has the transmission axis inclined by 45° with respect to the primary surface of the carrier 160 so as to transmit the optical beam output from the Faraday rotator, $5c_1$ and $5c_2$. Two optical beams passing through the output linear polarizer, $5a2_1$ and $5a2_2$, enter respective wave plates, $5d_1$ and $5d_2$.

The wave plates, $5d_1$ and $5d_2$, same as the second embodiment, are set in the crystallographic c-axis thereof such that one of the wave plates rotates the polarization by +45° but the other wave plate rotates the polarization by −45°. Accordingly, the optical beam passing the first unit $51_1$ rotates the polarization thereof by 45° by the Faraday rotator $5c_1$ and further rotates by 45° by the wave plate $5d_1$. Accordingly, the optical beam output from the first unit $51_1$ only contains the polarization perpendicular to the primary surface of the carrier 160. On the other hand, the other optical beam passing through the second unit $51_2$ rotates the polarization thereof by 45° during passing the Faraday rotator $5c_2$ and rotates by −45° by the wave plate $5d_2$. That is, the polarization of the optical beam output from the second unit $51_2$ may recover the polarization of that of the optical beam just output from the MZ modulator 81 in parallel to the primary surface of the carrier 160.

The optical beam passing the first unit $51_1$ straightly enters the PBC 74A, and the other beam output from the second unit $51_2$ enters the PBC 74A bent in the optical axis thereof by substantially 90° by the mirror 7A. The PBC 74A, same as that of the aforementioned PBC 7, has a large transmittance (small reflectance) for the optical beam with the polarization parallel to the primary surface of the carrier 160, but a large reflectance (small transmittance) for the optical beam with the polarization perpendicular to the primary surface of the carrier 160. Thus, the PBC 74A efficiently combines two optical beams. The combined optical beam is concentrated on an end of the output optical fiber secured in the optical output port 88 by a concentrating lens implemented within the port 88.

The above are exemplary modes of carrying out the invention and are not intended to be limiting. It will be apparent to those of ordinary skill in the art that modifications thereto can be made without departure from the spirit and scope of the invention asset forth in the following claims.

What is claimed is:

1. A transmitter optical module, comprising:
first and second optical sources that emit first and second optical beams, respectively;
a polarization beam combiner that combines the first optical beams with the second optical beam; and
an optical isolator including a first unit and a second unit, the first unit receives the first optical beam output by the first optical source and provides the first optical beam to the polarization beam combiner, the first optical beam containing only a first polarization, the second unit receives the second optical beam output from the second optical source and provides the second optical beam to the polarization beam combiner, the second optical beam containing only a second polarization perpendicular to the first polarization to the polarization beam combiner,
wherein the first unit of the optical isolator includes a polarization dependent isolator and a wave plate in an output of the polarization dependent isolator, the wave plate having a crystallographic c-axis inclined by a quarter of a right angle from a transmission axis of the polarization dependent isolator, and
wherein the second unit of the optical isolator includes a polarization dependent isolator and a wave plate in an output of the polarization dependent isolator of the second unit, the wave plate of the second unit having a crystallographic c-axis making a right angle against the crystallographic c-axis of the wave plate of the first unit.

2. The transmitter optical module of claim 1,
wherein the polarization dependent isolators in the first unit and second unit, respectively, are integrally formed.

3. The transmitter optical module of claim 1,
wherein the optical isolator further includes a pair of magnets and a sub-mount, the sub-mount disposing the first unit, the second unit, and the magnets thereon, the first unit and the second unit being disposed in a side-by-side arrangement between the magnets.

4. The transmitter optical module of claim 1,
wherein the optical isolator further includes a magnet and a sub-mount, the sub-mount disposing the first unit and the second unit thereon,
the magnet extending substantially in parallel to the sub-mount and disposed above the sub-mount.

5. The transmitter optical module of claim 1,
wherein the optical isolator further includes a magnet disposing the first unit and the second unit thereon in a side-by-side arrangement.

6. The transmitter optical module of claim 1,
further including a carrier having a primary surface that disposes the first optical source, the second optical source, the optical isolator, and the polarization beam combiner thereon,
wherein the first optical source and the second optical source are semiconductor laser diodes that emit the first beam and a second beam, respectively, each having polarizations substantially in parallel to the primary surface of the carrier,
wherein the optical isolator receives the first optical beam and the second optical beam from the first optical source and the second optical source, respectively, and provides the first optical beam and the second optical beam to the polarization beam combiner, and
wherein the first optical beam provided from the optical isolator has a polarization one of in parallel to and in perpendicular to the primary surface of the carrier, and the second optical beam provided from the optical isolator has another polarization another of in parallel to and in perpendicular to the primary surface of the carrier.

7. The transmitter optical module of claim 6, wherein the first and second optical beams emitted from the first and second optical source have respective wavelengths different from others.

8. The transmitter optical module of claim 1, further including an optical modulator of a type of a Mach-Zehnder modulator that has a first output port and a second output port, the first output port operating as the first optical source and the second output port operating as the second optical source, the first output port outputting the first optical beam and the second output port outputting the second optical beam, the first optical beam has a polarization same with a polarization of the second optical beam.

9. The transmitter optical module of claim 8, further including a carrier having a primary surface that disposes the Mach-Zehnder modulator, the polarization beam combiner, and the optical isolator thereon, the optical isolator including a sub-mount that disposes the first unit and the second unit thereon, wherein the polarization of the first optical beam and the polarization of the second optical beam each output from the first output port and the second output port of the Mach-Zehnder modulator, respectively, are in parallel to the primary surface of the carrier, and wherein the polarization of one of the first optical beam and the second optical beam output from the optical isolator is in perpendicular to the primary surface of the carrier but the polarization of another of the first optical beam and the second optical beam each output from the optical isolator is in parallel to the primary surface of the carrier.

10. A transmitter optical module, comprising:
a first optical source and a second optical source each emitting a first optical beam and a second optical beam, respectively, the first optical beam having a polarization substantially same with a polarization of the second optical beam;
an optical isolator that receives the first optical beam and the second optical beam from the first optical source and the second optical source, respectively, and outputs the first optical beam and the second optical beam each having respective polarizations in perpendicular or in parallel to the polarization of the first optical beam and the polarization of the second optical beam each output from the first optical source and the second optical source, respectively, but not entering the optical isolator;
a half-wave plate that rotates the polarization of one of the first optical beam and the second optical beam each outputting from the optical isolator; and
a polarization beam combiner that combines one of the first optical beam and the second optical beam output from the half-wave plate with another of the first optical beam and the second optical beam output from the optical isolator,
wherein the optical isolator further includes an input linear polarizer, a Faraday rotator, and an output linear polarizer, the input linear polarizer aligning a polarization of the first optical beam with a polarization of the second optical beam each entering the optical isolator, the Faraday rotator rotating the polarization of the first optical beam and the second optical beam each output from the input linear polarizer by 45° from a transmission axis of the first linear polarizer, the output linear polarizer having a transmission axis inclined by 45° from the transmission axis of the first linear polarizer.

11. The transmitter optical module of claim 10, wherein the half-wave plate has a crystallographic c-axis inclined by an angle of 45° from the transmission axis of the output linear polarizer.

12. The transmitter optical module of claim 11, wherein the optical isolator further includes a sub-mount that disposes the input linear polarizer, the Faraday rotator, the output linear polarizer, the wave plate, and the half-wave plate thereon.

13. An optical isolator, comprising:
a first unit including an input linear polarizer, a Faraday rotator, and an output linear polarizer, the input polarizer having a transmission axis, the output linear polarizer having a transmission axis making a half right angle with respect to the transmission axis of the input linear polarizer;
a second unit including an input linear polarizer, a Faraday rotator, and an output linear polarizer, the input polarizer of the second unit having a transmission axis in parallel to the transmission axis of the input polarizer of the first unit, the output linear polarizer of the second unit having a transmission axis in parallel to the transmission axis of the output polarizer of the first unit but making a half right angle with respect to the transmission axis of the input linear polarizer of the second unit;
a first wave plate disposed in downstream of the first unit, the first wave plate having a crystallographic c-axis inclined by a quarter right angle with respect to a transmission axis of the output linear polarizer of the first unit; and
a second wave plate disposed in downstream of the second unit, the second wave plate having a crystallographic c-axis making a right angle with respect to the crystallographic c-axis of the wave plate in the first unit.

14. The optical isolator of claim 13, further including a pair of magnets to form a magnetic field for the Faraday rotators in the first and second units, and a sub-mount for mounting the first and second units thereof in a side-by-side arrangement between the magnets.

15. The optical isolator of claim 13, further including a magnet causing a magnetic field for the Faraday rotator in the first unit and the Faraday rotator in the second unit; and
a sub-mount that disposes the first unit and the second unit thereon in a side-by-side arrangement,
wherein the magnet is disposed above the sub-mount and extends in parallel to the sub-mount.

16. The optical isolator of claim 13, further including a magnet that causes a magnetic field for the Faraday rotator in the first unit and the Faraday rotator in the second unit,
wherein the magnet disposes the first unit and the second unit thereon in a side-by-side arrangement.

17. The optical isolator of claim 13, wherein the input linear polarizer in the first unit and the input linear polarizer in the second unit are integrally formed, the Faraday rotator in the first unit and the Faraday rotator in the second unit are integrally formed, and the output linear polarizer in the first unit and the output linear polarizer in the second unit are integrally formed.

* * * * *